US010345681B2

(12) United States Patent
Jiang et al.

(10) Patent No.: US 10,345,681 B2
(45) Date of Patent: Jul. 9, 2019

(54) COMPRESSIVE IMAGING USING STRUCTURED ILLUMINATION

(71) Applicant: Alcatel-Lucent USA Inc., Murray Hill, NJ (US)

(72) Inventors: Hong Jiang, Warren, NJ (US); Gang Huang, Monroe Township, NJ (US); Victor Yu, New Providence, NJ (US); Paul A. Wilford, Bernardsville, NJ (US); Xin Yuan, Summit, NJ (US)

(73) Assignee: Nokia of America Corporation, Murray Hill, NJ (US)

( * ) Notice: Subject to any disclaimer, the term of this patent is extended or adjusted under 35 U.S.C. 154(b) by 149 days.

(21) Appl. No.: 15/295,512

(22) Filed: Oct. 17, 2016

(65) Prior Publication Data

US 2018/0107095 A1    Apr. 19, 2018

(51) Int. Cl.
*H04N 5/225* (2006.01)
*H04N 5/235* (2006.01)
*G03B 15/05* (2006.01)
*H03M 7/30* (2006.01)

(52) U.S. Cl.
CPC .......... *G03B 15/05* (2013.01); *H03M 7/3062* (2013.01); *H04N 5/2256* (2013.01); *H04N 5/2354* (2013.01)

(58) Field of Classification Search
CPC ..... H04N 5/2256; H04N 5/2354; G03B 15/05
See application file for complete search history.

(56) References Cited

U.S. PATENT DOCUMENTS

| 2002/0186314 A1* | 12/2002 | Debevec ............... G03B 15/02 348/371 |
| 2005/0285860 A1* | 12/2005 | Pfister ...................... G06T 7/40 345/426 |
| 2010/0134695 A1* | 6/2010 | O'Connell .............. A63J 5/021 348/722 |
| 2012/0069342 A1 | 3/2012 | Dalgleish et al. |
| 2012/0127345 A1* | 5/2012 | Matsunaga .......... H04N 5/2353 348/231.99 |

(Continued)

FOREIGN PATENT DOCUMENTS

CN         103363924 B      2/2016

OTHER PUBLICATIONS

International Search Report and Written Opinion for PCT/US2017/055239, dated Dec. 21, 2017, 12 pages.

(Continued)

*Primary Examiner* — Lin Ye
*Assistant Examiner* — John H. Morehead, III

(57) ABSTRACT

A plurality of lighting elements is configured to selectively illuminate a scene during a plurality of time intervals. The plurality of lighting elements forms a different illumination pattern in each of the plurality of time intervals. One or more sensors are configured to measure a plurality of intensities of light received from the scene during the plurality of time intervals. A processor is configured to generate an image of the scene based on the plurality of intensities. In some cases, the plurality of lighting elements are switched on or off to produce different illumination patterns during a plurality of time intervals that too short to be perceptible to the human eye.

20 Claims, 7 Drawing Sheets

(56) References Cited

U.S. PATENT DOCUMENTS

| | | | | |
|---|---|---|---|---|
| 2012/0154577 A1* | 6/2012 | Yoshikawa | ............... | H04N 7/18 |
| | | | | 348/140 |
| 2012/0206050 A1* | 8/2012 | Spero | ....................... | B60Q 1/04 |
| | | | | 315/152 |
| 2012/0257091 A1* | 10/2012 | Kim | ..................... | H04N 5/2354 |
| | | | | 348/297 |
| 2013/0201297 A1 | 8/2013 | Jiang | | |
| 2014/0168459 A1* | 6/2014 | Spielberg | ............. | H04N 5/2354 |
| | | | | 348/222.1 |
| 2014/0314420 A1* | 10/2014 | De Bruijn | .......... | H05B 37/0272 |
| | | | | 398/127 |
| 2016/0006914 A1* | 1/2016 | Neumann | ............. | G06F 3/0325 |
| | | | | 348/78 |
| 2016/0323518 A1* | 11/2016 | Rivard | ................... | H04N 5/247 |
| 2017/0134680 A1 | 5/2017 | Zhong et al. | | |

OTHER PUBLICATIONS

Sun, Y. et al., "High-speed compressive range imaging based on active illumination", Optics Express 22836, col. 24, No. 20, Oct. 3, 2016, 11 pages.

\* cited by examiner

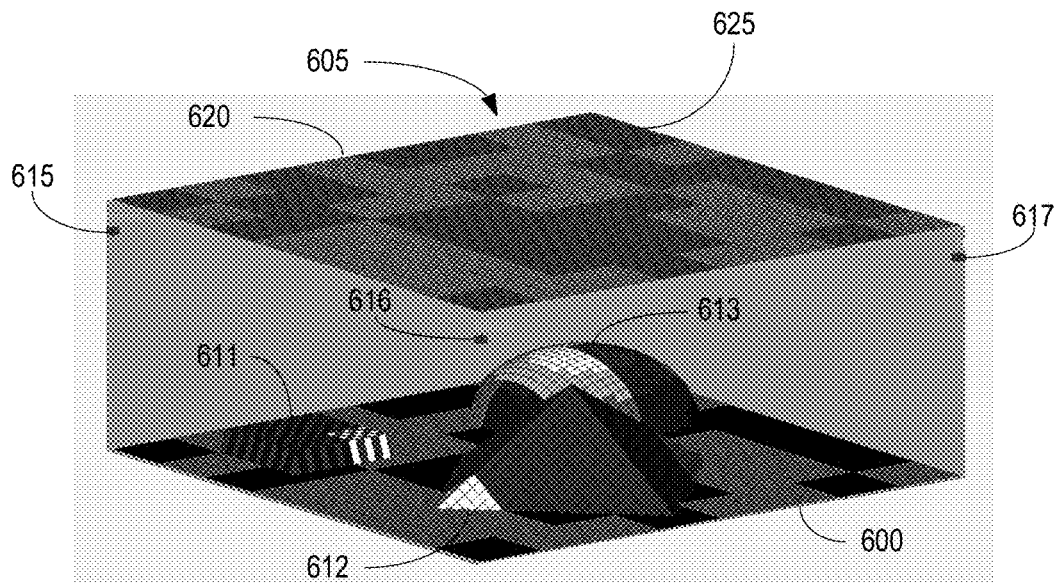
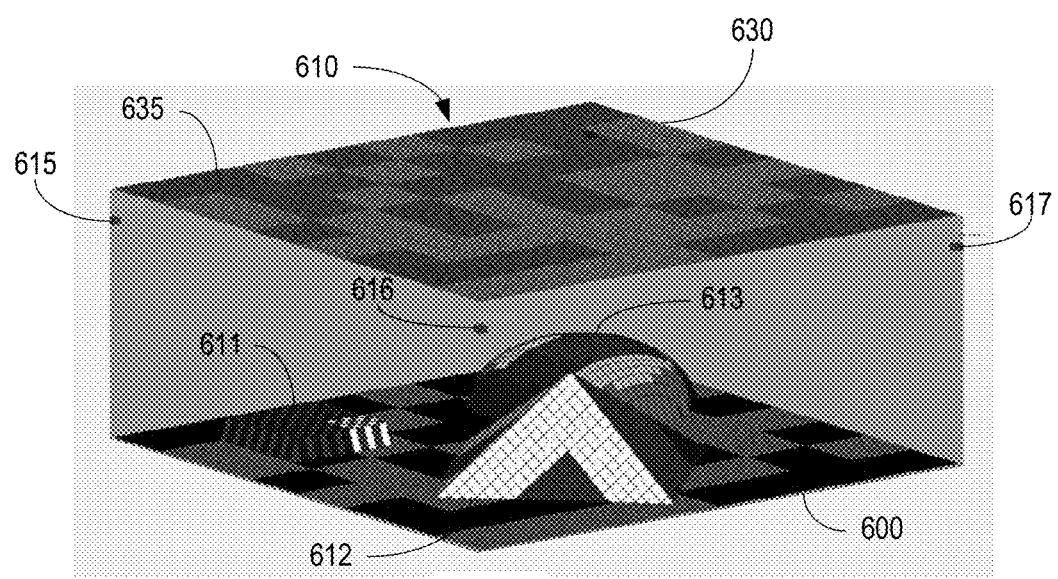
FIG. 6

COMPRESSIVE IMAGING USING STRUCTURED ILLUMINATION

BACKGROUND

Field of the Disclosure

The present disclosure relates generally to digital imaging systems and, more particularly, to acquiring images of an illuminated scene using digital imaging systems.

Description of the Related Art

Conventional digital image acquisition requires deploying an array of detectors at an image plane of an image acquisition device and exposing the array of detectors to light received from a scene. The detectors generate signals that are proportional to the intensity of the light falling on the detector. A complete image of the scene is produced using the intensities generated by the array of detectors. Each detector corresponds to a pixel of the acquired image. As used herein, the term "pixel" refers to a single scalar element of a multi-component representation of the image. Acquiring the information representative of the portion of the image represented by each pixel therefore requires performing a separate measurement of the intensity of the light falling on the detector corresponding to the pixel. Consequently, the number of measurements required to produce an image in a conventional digital acquisition system is equal to the number of pixels used to represent the image.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 6 is a diagram illustrating a scene illuminated by an array that is generating a first illumination pattern and the same scene illuminated by the same array generating a second illumination pattern according to some embodiments.

DETAILED DESCRIPTION

Figure 1:
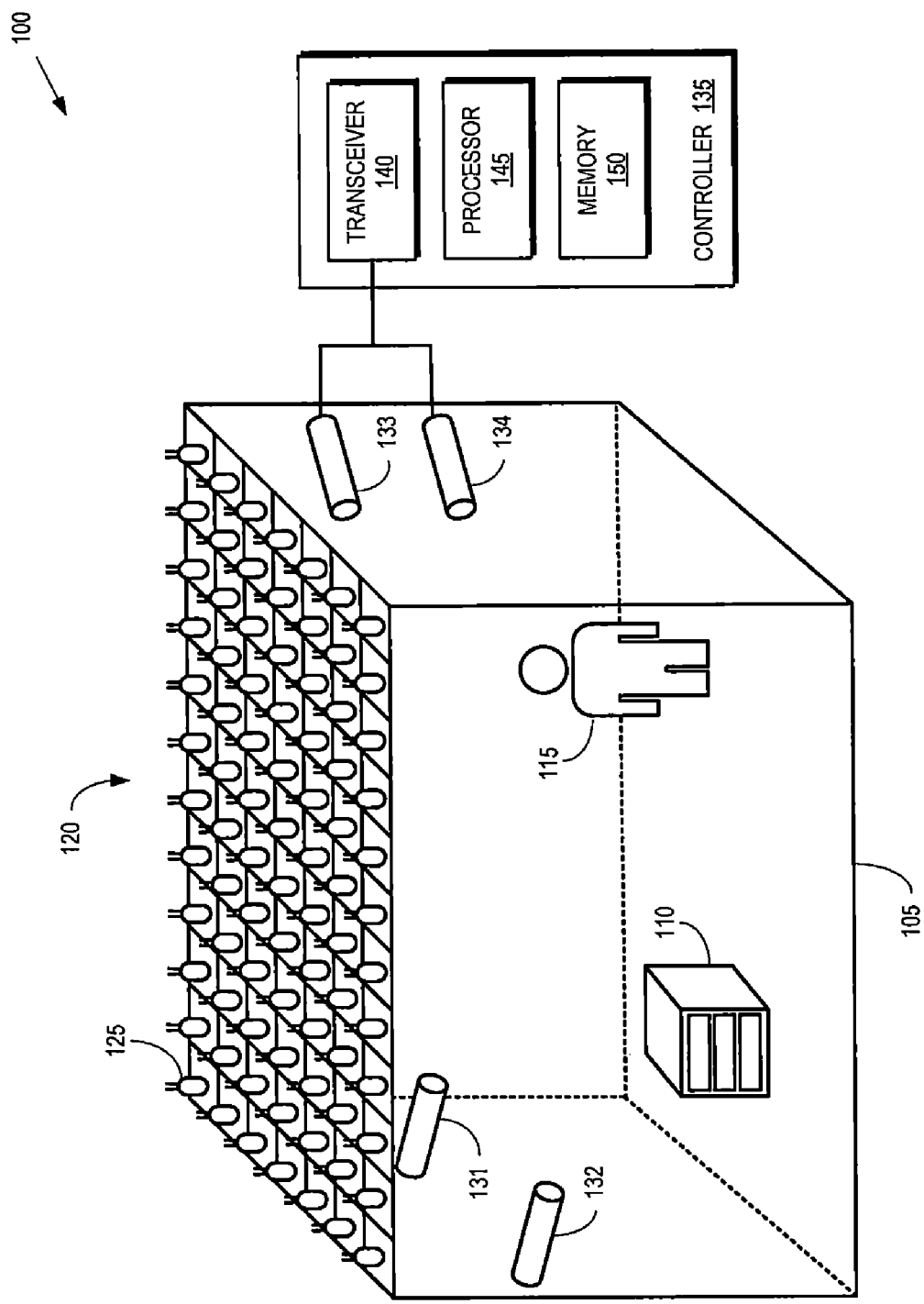
FIG. 1 is a block diagram illustrating an image acquisition system according to some embodiments.

Compressive sensing techniques can be used to reduce the number of measurements that need to be performed to acquire the information needed to represent the image. In compressive sensing, M compressive measurements representing a compressed version of an N-pixel image are directly acquired without first acquiring the raw data for each of the N pixels of the N-pixel image (M is less than N). This eliminates or reduces the need for compressing the image after acquisition as is done in conventional systems where the raw-data for each of the N pixels representing the image is acquired first is then compressed (e.g., into a JPEG compressed image) using conventional compression techniques. For example, a "lens-less" camera includes an array of shutters that are selectively opened or closed to allow light from a scene to reach a detector in the lens-less camera. Each of the shutters corresponds to a pixel of the acquired image. Sets of the shutters are opened together to define apertures that allow light to fall on the detector so that the detector is able to perform measurements of the intensity of the light received from the scene. Each measurement is performed by the detector for a different set of open shutters that define a different aperture. The complete image can be reconstructed from a number of measurements that is significantly less than the number of pixels in the image, thereby compressing the information required to represent the image. However, there are drawbacks to using lens-less cameras. Changing the aperture in a lens-less camera by changing the set of open shutters is relatively slow. For example, changing between shutter sets typically occurs at frequencies on the order of hundreds of Hertz if a liquid crystal display (LCD) is used to implement the shutter. Consequently, the lens-less camera requires a relatively long acquisition time to perform sufficient measurements to reconstruct the image.

Compressive sensing of a scene without a lens or aperture is performed by selectively illuminating the scene during a sequence of time intervals with different subsets of a plurality of lighting elements that form different illumination patterns. Some embodiments of the lighting elements are implemented as light emitting diodes (LEDs) that can be switched on and off at high frequencies, e.g., on the order of hundreds of megahertz (MHz). A sensor measures intensities of light received from the scene while it is illuminated by the subsets of the plurality of lighting elements during the time intervals. An image of the scene represented by a number of pixels equal to the number of lighting elements is reconstructed from the measured intensities and the corresponding illumination patterns. The number of measured intensities from a sensor is less than the number of lighting elements. In some embodiments, multiple sensors at different locations measure intensities of the light received from the scene when illuminated by the subsets of the plurality of lighting elements during the time intervals. Joint reconstruction can be used to create a common image from the intensities measured by the different sensors, e.g., by defining a projection matrix that projects each of the images generated using measurements performed by each of the sensors onto the common image.

In some embodiments, a proportion of the plurality of lighting elements that are switched on according to the illumination patterns is determined based on a target lighting level or a minimum degree of fluctuation in the lighting level. For example, the plurality of lighting elements can be used to illuminate a conference room and the number of lighting elements that are switched on during each time interval can be determined to provide sufficient light for the conference room with an amount of fluctuation in the lighting level that is imperceptible to people in the conference room.

FIG. 1 is a block diagram illustrating an image acquisition system 100 according to some embodiments. The image acquisition system 100 is configured to acquire one or more images of a scene 105 that includes one or more objects 110 or people 115. The scene 105 is illuminated by an array 120 of lighting elements 125 (only one indicated by a reference numeral in the interest of clarity). Each of the lighting elements 125 can be independently switched on or off. Switching a lighting element 125 on or off can also be referred to as activating or deactivating, respectively, the lighting element 125. Each lighting element 125 illuminates a portion of the scene 105 when switched on and, when switched off, the lighting elements 125 are dark and do not illuminate the scene 105. The array 120 can therefore generate different illumination patterns by switching different subsets of the lighting elements 125 on or off during different time intervals. Some embodiments of lighting elements 125 in the array 120 are switched on or off at a frequency between 10 megahertz (MHz) and 1 gigahertz (GHz) to selectively illuminate the scene during a sequence of time intervals having durations between 1 nanosecond and 100 nanoseconds. For example, the lighting elements 125 can be implemented as light emitting diodes (LEDs) that can transition between an on state and an off state at frequencies on the order of hundreds of MHz.

One or more sensors monitor the scene to measure intensities of the light received from the scene when illuminated by the different illumination patterns during the different time intervals. In the illustrated embodiment, the scene 105 is monitored by four sensors 131, 132, 133, 134 (collectively referred to herein as "the sensors 131-134") that can be implemented as photodiodes that integrate the intensity of light reflected from illuminated portions of the objects 110 or the people 115 over the time intervals. Measurements performed by the sensors 131-134 therefore provide a signal that is proportional to the intensity of the light reflected from the scene 105 and collected by the sensors 131-134 during the time interval, e.g., the integrated intensity of light received at the sensors 131-134 over the time interval. Larger sensors 131-134 typically collect more light and so the sizes of the sensors 131-134 can be increased to improve the signal-to-noise ratio of the measured intensities. Although four sensors 131-134 are shown in FIG. 1, more or fewer sensors can be implemented in other embodiments of the image acquisition system 100.

Operation of the sensors 131-134 and the lighting elements 125 is synchronized so that each of the sensors 131-134 integrates the intensity of the received light over the same time interval during which the lighting elements 125 are selectively illuminating the scene using a single illumination pattern. Consequently, the measurements performed by each sensor 131-134 during a time interval indicate the measured intensity of the light-reflected from portions of the objects 110 or the people 115 that are illuminated by a subset of the lighting elements 125 that are switched on during the time interval to generate the corresponding illumination pattern. Each of the sensors 131-134 therefore performs one measurement of the intensity of the light reflected from the scene 105 during each time interval corresponding to a single illumination pattern. This process is a form of compressive sensing (and the measurements can be referred to as compressive measurements) because the sensors 131-134 only detect light reflected from a portion of the objects 110 or the people 115 that are illuminated by a subset of the lighting elements 125, and an image can be created from a number of sensor measurements that is significantly less than total pixels (light elements) of the image.

The image acquisition system 100 includes a controller 135 that is configured to select the subsets of the lighting elements 125 that are in each illumination pattern, synchronize operation of the lighting elements 125 and the sensors 131-134, or generate images based on the signals representative of the integrated intensities measured by the sensors 131-134 in a sequence of time intervals corresponding to different illumination patterns. The acquisition system 100 is responsible for properly acquiring the light intensity measurements, but the generation of the images based on the measurements may or may not be performed on the controller 135. Some embodiments of the acquisition system 100 may pass the measurements to another device, such as a cloud based device, which can use the provided information to generate the images. The controller 135 includes a transceiver 140 for transmitting and receiving signals. For example, the transceiver 140 can transmit signals that cause different subsets of the lighting elements 125 to be switched on or off. For another example, the transceiver 140 can receive signals representative of the integrated intensities measured by the sensors 131-134. For yet another example, the transceiver 140 can transmit the intensity measurements to another device, or transmit images to another location if the images are generated by the controller 135. In the interest of clarity, not all of the individual connections between the transceiver 140 and the lighting elements 125 or the sensors 131-134 are shown in FIG. 1. The transceiver 140 can be implemented as a single integrated circuit (e.g., using a single ASIC or FPGA) or as a system-on-a-chip (SOC) that includes different modules for implementing the functionality of the transceiver 140. The transceiver 140 may use wired or wireless, or both, for communication with the sensors 131-134 or other devices.

The controller 135 also includes a processor 145 and a memory 150. The processor 145 can be used to execute instructions stored in the memory 150 and to store information in the memory 150 such as the results of the executed instructions. Some embodiments of the processor 145 determine the illumination patterns used during a sequence of time intervals. For example, if N is the total number of lighting elements 125 in the array 120 and M is the number of time intervals in the sequence, the processor 145 generates an M×N sensing matrix, A, which has M rows and N columns. Each entry in the sensing matrix has a value that indicates whether the corresponding lighting element 125 is turned on or off during the different time intervals. For example, a value of 1 in the m-th row and n-th column indicates that the n-th lighting element 125 is turned on during the m-th time interval. For another example, a value of 0 in the m-th row and n-th column indicates that the n-th lighting element 125 is turned off during the m-th time interval. In some embodiments, the number of time intervals is less than the number of lighting elements, e.g., M<N.

The sensing matrix can be implemented as a modified N×N Hadamard matrix. A Hadamard matrix includes entries with values of 1 and −1. A modified Hadamard matrix can be obtained, for example, with the following three steps: (1) replace the value −1 in the N×N Hadamard matrix by value 0, (2) randomly permute the columns of the matrix obtained from (1), and (3) randomly select M rows from the N rows of the matrix obtained from (2). In some embodiments, the sensing matrix is generated by an entity that is different than the processor 145 and then information representative of the sensing matrix is transmitted to the processor 145, for example, through the transceiver 140. The processor 145 generates signals to turn the lighting elements 125 on or off during each time interval according to the values of entries in the corresponding row of the sensing matrix, which may be generated by the processor 145, or generated elsewhere but made known to the processor 145. The signals are provided to the transceiver 140, which uses the signals to generate control signals for the lighting elements 125.

Once the lighting elements 125 have been switched on or off to produce the illumination pattern for a time interval, the sensors 131-134 begin to integrate the intensity of the light reflected from the scene 105 during the time interval. The integration continues until the end of the time interval so that each of the sensors 131-134 obtains one measurement per time interval corresponding to the illumination pattern. Thus, each of the sensors 131-134 performs M measurements for the illumination patterns defined by the M rows of the sensing matrix. Each of the sensors 131-134 generates a measurement vector. For example, if S is the number of sensors, the measurement vector y for each sensor can be expressed as:

$$y^i = \begin{bmatrix} y_1^i \\ \vdots \\ y_M^i \end{bmatrix}, i=1,\ldots,S$$

Each of the measurement vectors corresponds to a vector of image pixels for an image produced by each sensor. The number of image pixels is equal to the number N of lighting elements 125. There is a measurement vector and an image vector associated with each sensor. The vectors, x, of image pixels of S sensors can therefore be expressed as:

$$x^i = \begin{bmatrix} x_1^i \\ \vdots \\ x_N^i \end{bmatrix}, i=1,\ldots,S$$

The measurement vectors and the vectors of image pixels are related by the sensing matrix:

$$y^i = Ax^i, i=1,\ldots,S$$

Thus, for each sensor i, compressive sensing according to the sensing matrix A produces a measurement vector $y^i$ that has a lower dimension (i.e., has fewer elements) than the corresponding vector $x^i$ of the image pixels. In other words, the number of measurements made by each sensor 131-134 is less than, and can be significantly less than, the number of pixels of the image from that sensor and this sense, compression of the images is achieved during the acquisition.

Some embodiments of the processor 145 perform image reconstruction to generate an image having N pixels from a smaller number (M) of measurements performed during the sequence of time intervals. For example, the processor 145 can be configured to generate an image associated with one or more of the sensors i by solving the compressive sensing problem:

minimize$\|Wx^i\|_1$ such that $y^i = Ax^i$, i=1,..., S where W is a sparsifying operator such as a total variation operator or a wavelet operator and y, A, and x are defined as above. For another example, the processor 145 can be configured to generate a common image x from the measurements performed by all of the sensors 131-134. The common image x is created by solving the compressive sensing problem:

$$\text{minimize } \|Wx\|_1 \text{ such that } \begin{bmatrix} y^1 \\ \vdots \\ y^S \end{bmatrix} = \begin{bmatrix} AP^1 \\ \vdots \\ AP^S \end{bmatrix} x$$

where $p^i$ represents a projection from the common image x to the image $x^i$ associated with the sensor i, and y, A, and x are defined as above. In some embodiments, the generation of the images as described above can be performed by a processor other than the processor 145. For example, the acquisition system 100 may transmit the measurement vectors $y^i$ to a device in another location, such as in a cloud, and the device in the other location can perform the process described above to generate the images.

Some embodiments of the lighting elements 125 generate non-parallel beams of light. For example, the spreading of the beams of light generated by the lighting elements 125 can be represented by a point spread function that can be determined by direct measurements of the light generated by the lighting elements 125. For another example, the spreading of the beams of light can be represented as a Gaussian distribution. The point spread function can be represented by K so that the measurement vector is determined based on a convolution of the sensing matrix A with the point spread function:

$$y^i = (A*K)x^i, i=1,\ldots,S$$

where the operator "*" represents convolution of A and K, and y, A, and x are defined as above. Reconstructing the image by solving the equation including the convolution of the point spread function with the sensing matrix can reduce or eliminate blurring in the reconstructed image that could be caused by the spreading of the beams generated by the lighting elements 125.

Figure 2:
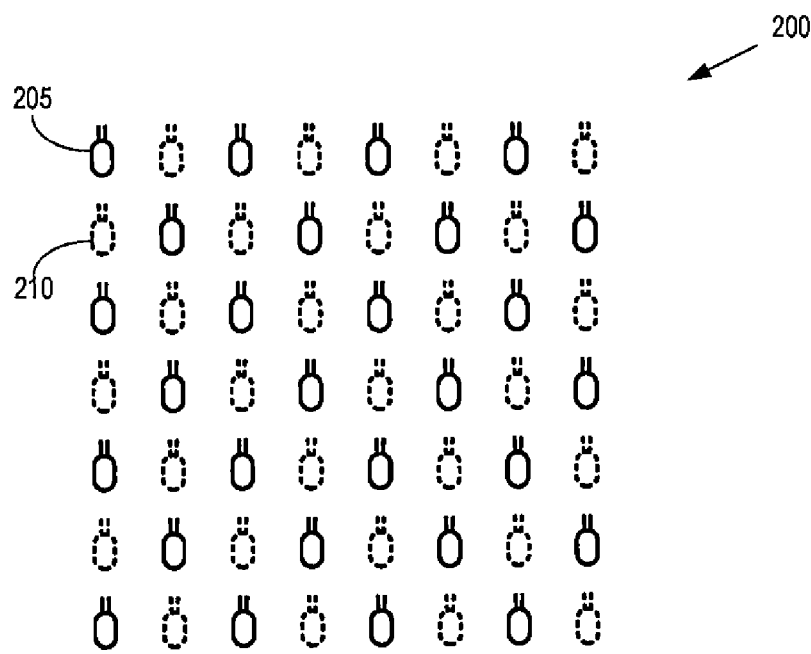
FIG. 2 is a diagram illustrating an array of lighting elements that are selectively switched on or off to define an illumination pattern in a time interval according to some embodiments.

FIG. 2 is a diagram illustrating an array 200 of lighting elements that are selectively switched on or off to define an illumination pattern in a time interval according to some embodiments. The array 200 includes lighting elements 205 (only one indicated by a reference numeral in the interest of clarity) that are switched on during the time interval, as indicated by the solid lines. The array 200 also includes lighting elements 210 (only one indicated by a reference numeral in the interest of clarity) that are switched off during the time interval, as indicated by the dotted lines. The number of lighting elements 205 that are switched on during the time interval is equal to the number of lighting elements 210 that are switched off during the time interval. As discussed herein, the number of lighting elements 205 that are switched on can be determined based on a target lighting level for the scene that is to be illuminated by the array 200. For example, the number of lighting elements 205 can be determined based on a target lighting level that provides a desired level of illumination within a room such as a conference room. The number of lighting elements 205 that are switched on can also be determined based on a desired property of the sensing matrix A. For example, the number of lighting elements 205 can be determined based on a modified Hadamard matrix as previously described.

Figure 3:
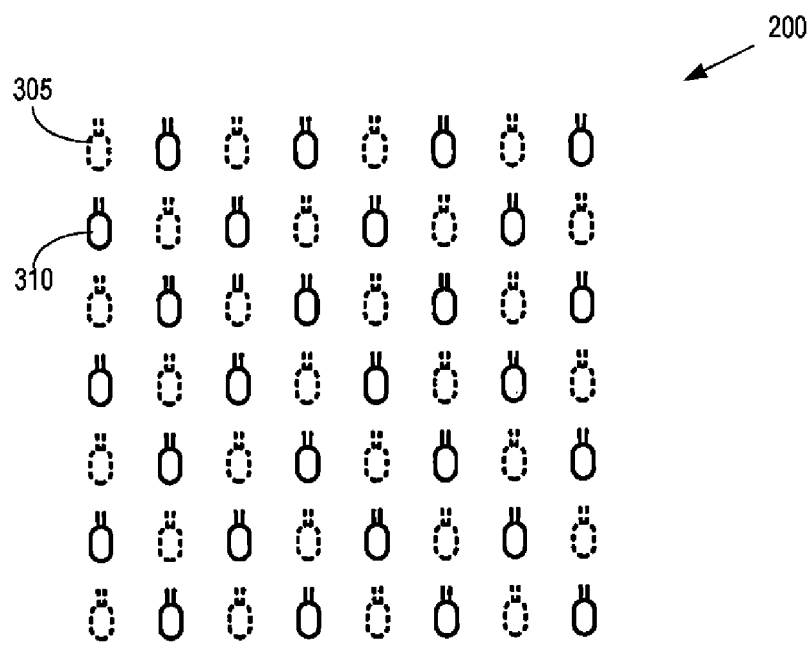
FIG. 3 is a diagram illustrating the array of lighting elements that are selectively switched on or off to define an illumination pattern in a time interval that is subsequent to the time interval shown in FIG. 2.

FIG. 3 is a diagram illustrating the array 200 of lighting elements that are selectively switched on or off to define an illumination pattern in a time interval that is subsequent to the time interval shown in FIG. 2. The array 200 includes lighting elements 305 (only one indicated by a reference numeral in the interest of clarity) that are switched off during the time interval, as indicated by the dotted lines. The array 200 also includes lighting elements 310 (only one indicated by a reference numeral in the interest of clarity) that are switched on during the time interval, as indicated by the solid lines. The number of lighting elements 310 that are switched on during the time interval is equal to the number of lighting elements 305 that are switched off during the time interval. As discussed herein, the number of the lighting elements 205 that are switched on during the time interval depicted in FIG. 2 and the number of lighting elements 310 that are switched on during the time interval depicted in FIG. 3 can be determined based on a degree of fluctuation in a lighting level in a scene that is illuminated by the array 200. The lighting elements 125 can be switched on or off very rapidly, that is, the time interval for which a lighting element is switched on or off can be very short. In some embodiments, the speed at which the elements 125 are switched on or off is made so fast that the degree of fluctuation in the lighting level in the scene illuminated by the array 200 is imperceptible to the human eye.

Figure 4:
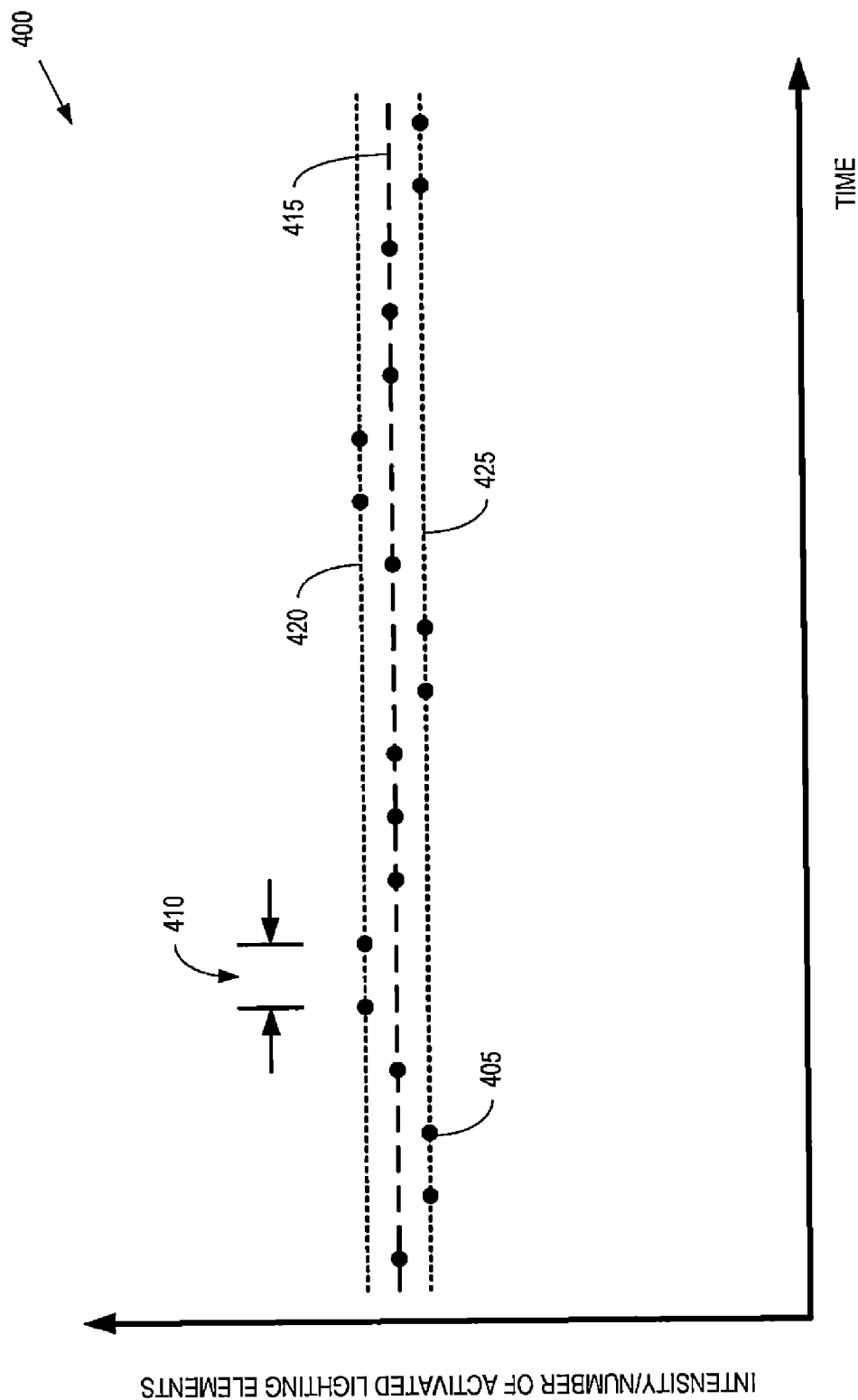
FIG. 4 is a plot illustrating a number of activated lighting elements as a function of time according to some embodiments.

FIG. 4 is a plot 400 illustrating a number of activated lighting elements as a function of time according to some embodiments. The plot 400 illustrates the number of activated (i.e., switched on) lighting elements in some embodiments of the array 120 shown in FIG. 1. The vertical axis indicates (in arbitrary units) an intensity of the lighting level in a scene or a number of activated lighting elements that are illuminating the scene according to different illumination patterns. The horizontal axis indicates (in arbitrary units) time increasing from left to right. The number of activated lighting elements for the different illumination patterns used to illuminate the scene during each time interval is indicated by a filled circle 405 (only one indicated by a reference numeral in the interest of clarity). Each illumination pattern is utilized for a time interval of the same duration 410. However, in some embodiments, time intervals of different durations are used for different illumination patterns.

The illumination patterns may be chosen so that the numbers 405 of activated lighting elements in each of the illumination patterns produces an average lighting level 415 that is equal to a target lighting level for the scene. The illumination patterns are also chosen so that a degree of fluctuation in the intensity is less than a threshold level. For example, the numbers 405 of activated lighting elements in each of the time intervals are chosen so that the degree of fluctuation in the intensity is less than a threshold level defined by a maximum intensity 420 and a minimum intensity 425. The difference between the maximum intensity 420 and the minimum intensity 425 can be selected so that fluctuations in the intensity due to changing the numbers of activated lighting elements at a frequency defined by the time interval 410 is imperceptible to the human eye. For example, the difference between the maximum intensity 420 and the minimum intensity can be selected so that fluctuations between the intensities 420, 425 at frequencies between 10 MHz and 1 GHz (corresponding to time intervals 410 between 1 and 100 nanoseconds) are imperceptible to the human eye.

In some embodiments, the illumination patterns are determined by a modified Hadamard matrix. When a modified Hadamard matrix is used, the number of lighting elements that are switched on is always the same as the number of lighting elements that are switched off. Therefore, there is a constant level of intensity as perceived by human eye when the frequency of changes in illumination patterns is high enough, for example, higher than 120 Hz.

Figure 5:
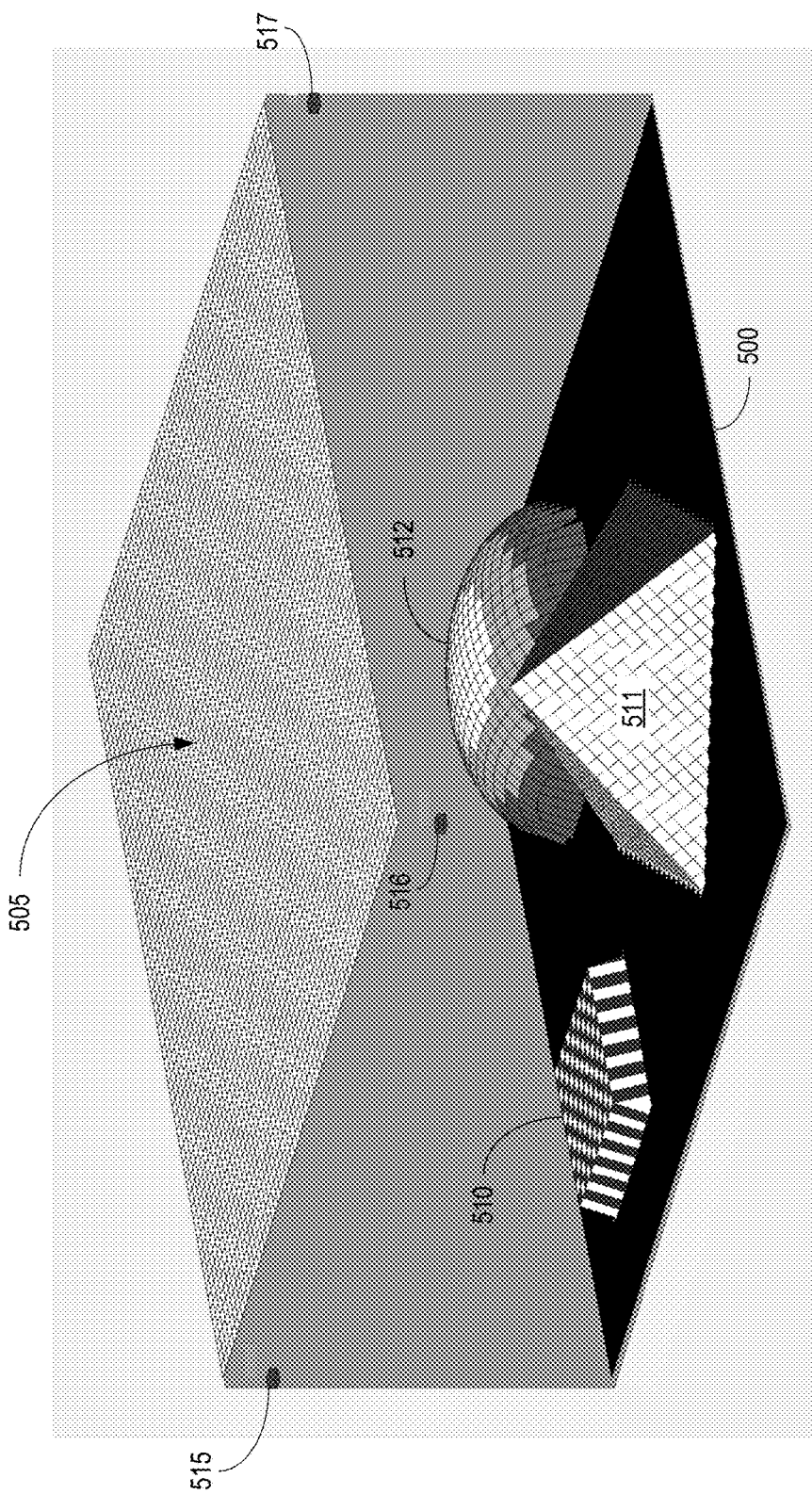
FIG. 5 is a diagram illustrating a scene that is illuminated by an overhead array of lighting elements according to some embodiments.

FIG. 5 is a diagram illustrating a scene 500 that is illuminated by an overhead array 505 of lighting elements according to some embodiments. The scene 500 represents some embodiments of the scene 105 shown in FIG. 1. The scene includes three objects 510, 511, 512 that are collectively referred to herein as "the objects 510-512."

In the illustrated embodiment, all of the lighting elements in the overhead array 505 are activated (or switched on) to provide uniform lighting within the scene 500. The intensity of the light reflected from surfaces of the objects 510-512 is indicated by the color of the corresponding surface. For example, a surface of the pyramid object 511 facing out of the plane of the drawing reflects light with the strongest intensity (as indicated by the white surface), the surface facing to the left reflects light with the next strongest intensity (as indicated by the light gray surface), and the surface facing to the right reflects light with the lowest intensity (as indicated by the dark gray surface).

The light reflected from the objects 510-512 is collected by the sensors 515, 516, 517 (collectively referred to herein as "the sensors 515-517") during a corresponding time interval. As discussed herein, the sensors 515-517 integrate the received light intensity over the time interval and generate a signal representative of the integrated light intensity. The signals can be used to generate images of the scene 500.

FIG. 6 is a diagram illustrating a scene 600 illuminated by an array that is generating a first illumination pattern 605 and the same scene 600 illuminated by the same array generating a second illumination pattern 610 according to some embodiments. The scene 600 includes the objects 611, 612, 613 (collectively referred to herein as "the objects 611-613") and reflected light from the objects 611-613 is measured by sensors 615, 616, 617 (collectively referred to herein as "the sensors 615-617"). The scene 600 is illuminated by the first illumination pattern 605 during a first time interval and the scene 600 is illuminated by the second illumination pattern 610 during a second, subsequent time interval.

The first illumination pattern 605 is generated by switching on a first subset of the lighting elements in the array, as indicated by the lighter gray squares 620. The remaining (second) subset of the lighting elements are switched off, as indicated by the darker gray squares 625. The second illumination pattern 610 is generated by switching on a third subset of the lighting elements in the array, as indicated by the lighter gray squares 630. The remaining (fourth) subset of the lighting elements are switched off, as indicated by the darker gray squares 635. The third subset 630 differs from the first subset 620. The first subset 620 and the third subset 630 may include mutually exclusive subsets of the lighting elements or they may include partially overlapping subsets of the lighting elements.

The different illumination patterns 605, 610 generate different patterns of reflected light from the objects 611-613, as indicated by the different colors across portions of the surfaces of the objects 611-613. The sensors 615-617 integrate the intensities of the reflected light received from the objects 611-613 during the time intervals corresponding to the different illumination patterns 605, 610. The measurements of the integrated intensities collected by the sensors 615-617 can be used to construct images of the scene 600 using some embodiments of the compressive sensing techniques described herein.

Figure 7:
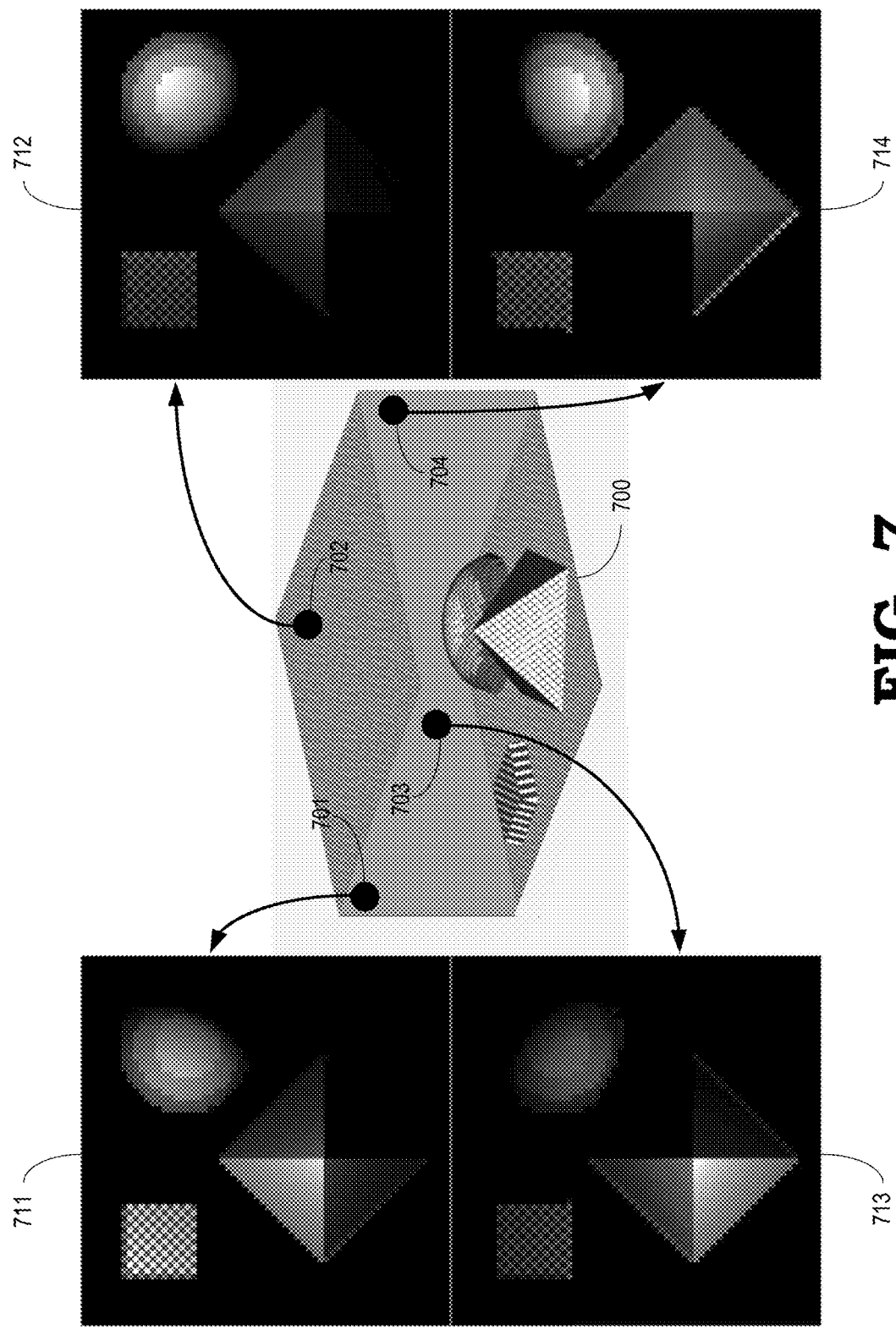
FIG. 7 is a diagram illustrating images of a scene generated from data collected by a set of detectors according to some embodiments.

FIG. 7 is a diagram illustrating a scene 700 that is illuminated by an array of lighting elements according to some embodiments. The scene 700 corresponds to some embodiments of the scene 600 shown in FIG. 6. A set of sensors 701, 702, 703, 704 (collectively referred to herein as "the sensors 701-704") monitors the scene and measures integrated intensities of light reflected from the scene 700 while the scene 700 is illuminated by different illumination patterns in different time intervals, as discussed herein. The measurements performed by the sensors 701-704 are used to generate corresponding images of the scene 700. For example, the measurements performed by the sensor 701 are used to generate an image 711, the measurements performed by the sensor 702 are used to generate an image 712, the measurements performed by the sensor 703 are used to generate an image 713, and the measurements performed by the sensors 704 are used to generate an image 714. In some embodiments, the measurements performed by the sensors 701-704 are used to generate a common image, as discussed herein.

Figure 8:
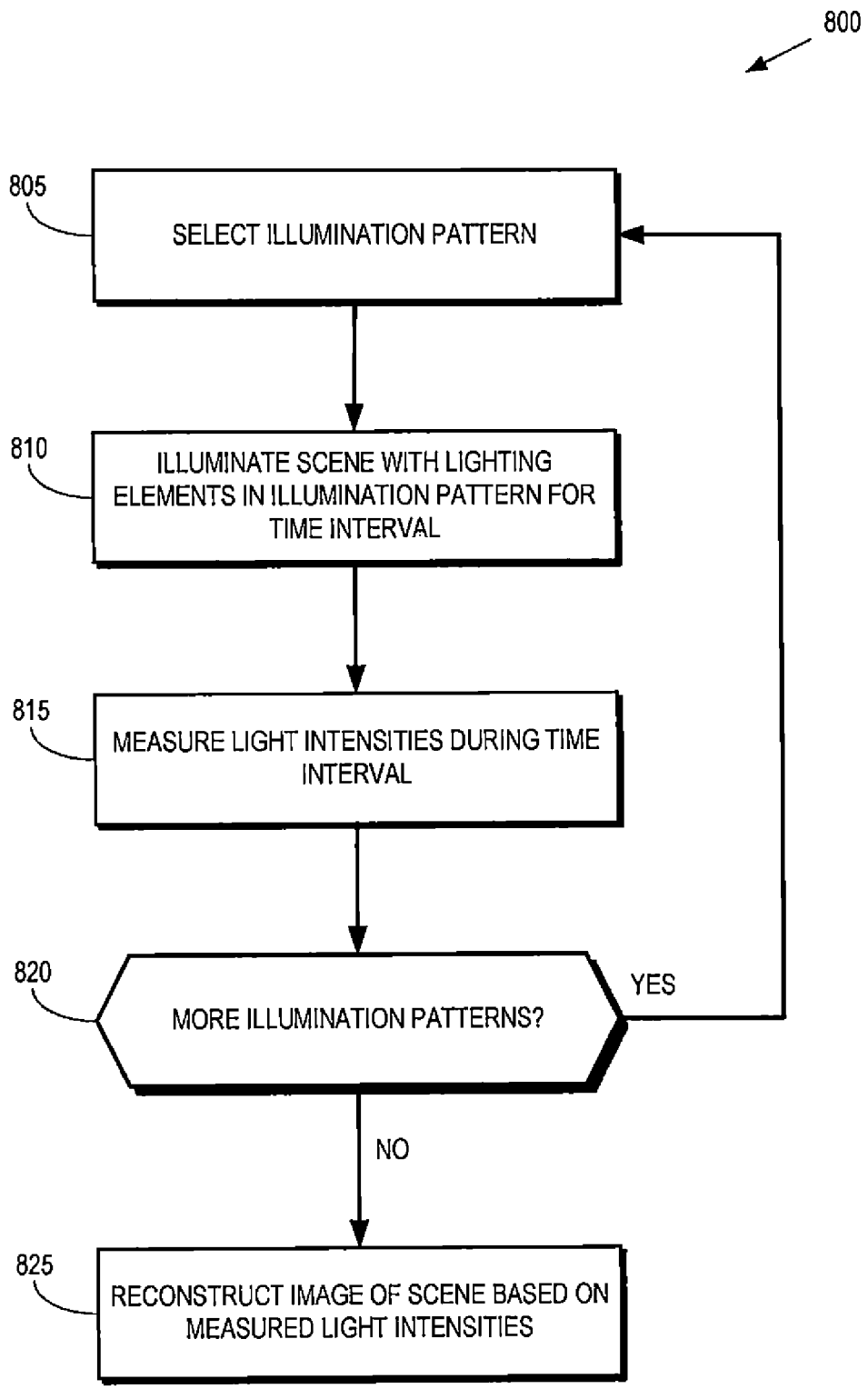
FIG. 8 is a flow diagram of a method for reconstructing an image of a scene using measurements performed concurrently with illuminating the scene with different illumination patterns according to some embodiments

FIG. 8 is a flow diagram of a method 800 for reconstructing an image of a scene using measurements performed concurrently with illuminating the scene with different illumination patterns according to some embodiments. The method 800 is implemented in some embodiments of the image acquisition system 100 shown in FIG. 1. For example, the method 800 can be implemented using the lighting elements 125, the sensors 131-134, and the controller 135 shown in FIG. 1.

At block 805, a controller selects an illumination pattern that indicates a subset of lighting elements that are to be switched on and switched off during a time interval, such as a time interval that has a duration within a range from 1 nanosecond to 100 nanoseconds. It is also possible to use a time interval of different duration. As discussed herein, the illumination pattern can be selected on the basis of a target lighting level produced by the switched-on subset of the lighting elements or a degree of fluctuations in the lighting level. The illumination patterns can also be selected based on a sensing matrix, such as a modified Hadamard matrix.

At block 810, the scene is illuminated by the lighting elements according to the illumination pattern defined by the controller, or made known to the controller. The illumination pattern is used to illuminate the scene for the time interval. At block 815, one or more sensors measure intensities of light reflected from the scene during the time interval, e.g., by integrating the received light over the duration of the time interval. Thus, although blocks 810 and 815 are shown as sequential in FIG. 8, the operations in blocks 810 and 815 are performed simultaneously or concurrently.

At decision block 820, the controller determines whether the scene is to be illuminated using the lighting elements configured to generate another illumination pattern. If so, the method flows to block 805 and the controller selects a new illumination pattern to illuminate the scene during a subsequent time interval. If not, the method flows to block 825.

At block 825, the controller reconstructs one or more images of the scene based on the measurements performed by the sensors during one or more time intervals. As discussed herein, the images can include images that represent views of the scene from the perspective of the individual sensors or a common image produced using measurements performed by multiple sensors. The function of block 825 can be performed by a controller such as the controller 135 shown in FIG. 1, or by a device outside of the acquisition system 100 shown in FIG. 1. If the controller does not perform the function of block 825, the acquisition system 100 transmits the measurements to the device outside of the acquisition system 100.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
selectively illuminating a scene during a plurality of time intervals with different subsets of a plurality of lighting elements to form a different illumination pattern in each of the plurality of time intervals;
measuring a plurality of intensities of light reflected by the scene and received by a sensor while the scene is illuminated by the different illumination patterns during the plurality of time intervals; and
generating an image of the scene based on the plurality of intensities measured by the sensor during the plurality of time intervals, wherein generating the image of the scene comprises generating values of pixels that represent the image, and wherein a number of the pixels corresponds to a number of the plurality of lighting elements.

2. The method of claim 1, wherein selectively illuminating the scene comprises selectively illuminating the scene during a plurality of time intervals having durations that are too short to be perceptible to the human eye.

3. The method of claim 1, further comprising:
determining the different subsets of the plurality of lighting elements based on at least one of a target lighting level, a minimum degree of fluctuation of a lighting level, or properties of a sensing matrix that determines the different subsets of the plurality of lighting elements in the different illumination patterns.

4. The method of claim 1, wherein measuring the plurality of intensities comprises measuring the plurality of intensities during a number of the plurality of time intervals that is less than a number of the plurality of lighting elements.

5. The method of claim 1, wherein measuring the plurality of intensities comprises measuring the plurality of intensities during the plurality of time intervals using a plurality of sensors deployed at different locations relative to the scene.

6. The method of claim 1, wherein the number of pixels is equal to the number of the plurality of lighting elements.

7. The method of claim 6, wherein generating the image of the scene comprises performing joint reconstruction to create a common image from the plurality of intensities measured by a plurality of sensors.

8. The method of claim 7, wherein performing joint reconstruction comprises projecting images generated using measurements performed by each of the plurality of sensors onto a common image using a projection matrix.

9. An apparatus comprising:
a plurality of lighting elements configured to selectively illuminate a scene during a plurality of time intervals, wherein the plurality of lighting elements forms a different illumination pattern in each of the plurality of time intervals;
at least one sensor configured to measure a plurality of intensities of light reflected by the scene and received by the at least one sensor while the scene is illuminated by the different illumination patterns during the plurality of time intervals; and
at least one processor configured to generate an image of the scene based on the plurality of intensities measured by the at least one sensor during the plurality of time intervals, wherein the at least one processor is configured to generate values of pixels that represent the image, and wherein a number of the pixels corresponds to a number of the plurality of lighting elements.

10. The apparatus of claim 9, wherein the plurality of lighting elements is configured to selectively illuminate the scene during a plurality of time intervals having durations that are too short to be perceptible to the human eye.

11. The apparatus of claim 9, wherein the at least one sensor is configured to measure the plurality of intensities during a number of the plurality of time intervals that is less than a number of the plurality of lighting elements.

12. The apparatus of claim 9, wherein the at least one sensor comprises a plurality of sensors deployed at different locations relative to the scene, and wherein each of the plurality of sensors is configured to measure a corresponding plurality of intensities during the plurality of time intervals.

13. The apparatus of claim 9, wherein the number of pixels is equal to the number of the plurality of lighting elements.

14. The apparatus of claim 13, wherein the at least one processor is configured to determine different subsets of the plurality of lighting elements to form the different illumination patterns based on at least one of a target lighting level, a minimum degree of fluctuation of a lighting level, or properties of a sensing matrix that determines the different subsets of the plurality of lighting elements in the different illumination patterns.

15. The apparatus of claim 14, wherein the at least one processor is configured to perform joint reconstruction to create a common image from the plurality of intensities measured by a plurality of sensors.

16. The apparatus of claim 15, wherein the at least one processor is configured to project images generated using measurements performed by each of the plurality of sensors onto a common image using a projection matrix.

17. A method comprising:
measuring, using a sensor, a plurality of intensities of light received from a scene during a plurality of time intervals during which the scene is selectively illuminated by different subsets of a plurality of lighting elements that form a different illumination pattern in each of the plurality of time intervals; and
generating an image of the scene based on the plurality of intensities measured by the sensor during the plurality of time intervals, wherein the scene is represented by values of pixels, and wherein a number of the pixels corresponds to a number of the plurality of lighting elements.

18. The method of claim 17, wherein measuring the plurality of intensities comprises measuring the plurality of intensities during a plurality of time intervals having durations that are too short to be perceptible to the human eye.

19. The method of claim 17, wherein the number of pixels is equal to the number of the plurality of lighting elements.

20. The method of claim 17, wherein measuring the plurality of intensities comprises measuring the plurality of intensities during a number of the plurality of time intervals that is less than a number of the plurality of lighting elements.

* * * * *